United States Patent
Tsuchiya (10) Patent No.: US 6,449,750 B1
(45) Date of Patent: Sep. 10, 2002

(54) DESIGN VERIFICATION DEVICE, METHOD AND MEMORY MEDIA FOR INTEGRATED CIRCUITS

(75) Inventor: Takehiko Tsuchiya, Musashino (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/482,935

(22) Filed: Jan. 14, 2000

(30) Foreign Application Priority Data

Jan. 18, 1999 (JP) .......................................... 11-009373

(51) Int. Cl.$^7$ ............................................. G06F 17/50
(52) U.S. Cl. ................................ 716/4; 716/18; 716/3; 716/5; 716/6
(58) Field of Search ............................. 716/18, 3, 5–6, 716/17, 11, 4; 714/724

(56) References Cited

U.S. PATENT DOCUMENTS

| | | | | |
|---|---|---|---|---|
| 4,319,321 A | * | 3/1982 | Anastas et al. | 364/200 |
| 4,328,542 A | * | 5/1982 | Anastas et al. | 364/200 |
| 5,253,181 A | * | 10/1993 | Marui et al. | 364/489 |
| 5,493,508 A | * | 2/1996 | Dangelo et al. | 364/489 |
| 5,910,897 A | * | 6/1999 | Dangelo et al. | 364/488 |
| 6,049,662 A | * | 4/2000 | Saha et al. | 395/500.37 |
| 6,077,305 A | * | 6/2000 | Cheng et al. | 703/16 |
| 6,148,436 A | * | 11/2000 | Wohl | 716/18 |
| 6,279,146 B1 | * | 8/2001 | Evans et al. | 716/18 |
| 6,295,636 B1 | * | 9/2001 | Duperloup | 716/18 |

FOREIGN PATENT DOCUMENTS

JP            6-96153        4/1994

OTHER PUBLICATIONS

Norstrom et al. "Timed automata as task models for event-driven systems" Real–time Computing systems and applications 1999 6$^{th}$ international conference pp. 182–189.*

Guerra et al. "Cycle and phase accurate DSP modeling and intergration for hw/sw co–verification" Design automation conference 1999 36$^{th}$ Proceedings.*

* cited by examiner

*Primary Examiner*—Matthew Smith
*Assistant Examiner*—Granvill Lee
(74) *Attorney, Agent, or Firm*—Oblon, Spivak, McClelland, Maier & Neustadt, P.C.

(57) ABSTRACT

To provide a design verification device, a method and a memory medium therefor, for a semiconductor integrated circuit, capable of effectively introducing the formal verification in a higher-level design and capable of constructing a high-speed function verification environment with high verification assurance. A design verification device, a method and a memory medium therefor, for a semiconductor integrated circuit, has a function verification system which has an input of a circuit description before an alteration and a circuit description after the alteration and identifies an altered portion according to a disagreed portion, wherein formal verification is carried out for a circuit description that can assure an agreement with a key point corresponding to an output of a register and an input and an output of a signal in the circuit descriptions before and after the alteration, and verification is carried out by utilizing an event-driven simulation for a circuit description that cannot assure an agreement or equivalence of the key point.

27 Claims, 6 Drawing Sheets

《INPUT AND OUTPUT WAVEFORMS FOR CIRCUIT BEFORE ALTERATION》

FIG. 5A

《INPUT AND OUTPUT WAVEFORMS FOR CIRCUIT AFTER ALTERATION》

FIG. 5B

<<RTL SOURCE CODE BEFORE ALTERATION >>>

```
always @(posedge CLK) begin
  if (INPUT A && INPUT B && INPUT C)
    OUTPUT A <= b
  else
    OUTPUT A <= a
end
```

<<RTL SOURCE CODE AFTER ALTERATION >>>

```
always @(posedge CLK) begin
  if (INPUT A && INPUT B || INPUT C)
    OUTPUT A <= b
  else
    OUTPUT A <= a
end
```
← ALTERED PORTION · EXPECTATION VALUES OF THE ALTERED PORTION GENERATED FROM THE ABOVE DESCRIPTION
  INPUT  : INPUT A, INPUT B, INPUT C
  OUTPUT : OUTPUT A
  CLOCK  : CLK

|  | INPUT A | INPUT B | INPUT C | OUTPUT A | CLK |
|---|---|---|---|---|---|
| EXPECTATION VALUE 1 | 1 | 0 | 1 | b | RISING |
| EXPECTATION VALUE 2 | 1 | 1 | 0 | b | RISING |

DESIGN VERIFICATION DEVICE, METHOD AND MEMORY MEDIA FOR INTEGRATED CIRCUITS

BACKGROUND OF THE INVENTION

The present invention relates to design verification of an LSI, and relates, more particularly, to a design verification device, a method and a memory medium therefor, for a large-scale and complex circuit, that is, a semiconductor integrated circuit for which a high-speed verification of function is required with high verification assurance.

In a logic design stage of a semiconductor integrated circuit, an event-driven simulator simulates how an event is being processed through a circuit. The event refers to a plurality of kinds of input signals prepared for a circuit to be verified.

A function verification method according to the event-driven simulator involves an extremely large number of events as a circuit scale of the integrated circuit becomes larger, which leads to an enormously long simulation time. As a result, a turn-around time of design becomes longer.

Further, when the event-driven simulator is used, a designer must consider a combination (event) of input signals to be applied to a circuit of which operation is to be verified. The designer prepares this event as a test vector for individual function of the circuit.

In verifying complex functions of a circuit, it has become impossible to manually prepare a test vector that covers all the functions of the circuit. Therefore, there has been a trend that the verification assurance of the even-driven simulator is lowered when it is used for verifying a large-scale circuit having complex functions. The test vector refers to an input signal applied to an LSI for testing the LSI.

On the other hand, formal verification has been attracting attention as a technique for solving the above-described problems of the event-driven simulator. The formal verification is a method of verifying a function of a designed circuit by using a logic equation obtained from a circuit description of the circuit. According to the formal verification, verification of a function is carried out using the logic equation that reflects the circuit design to be verified (function equivalence check). Therefore, this method requires no test vector, thus ensuring a 100% verification assurance.

Figure 1:
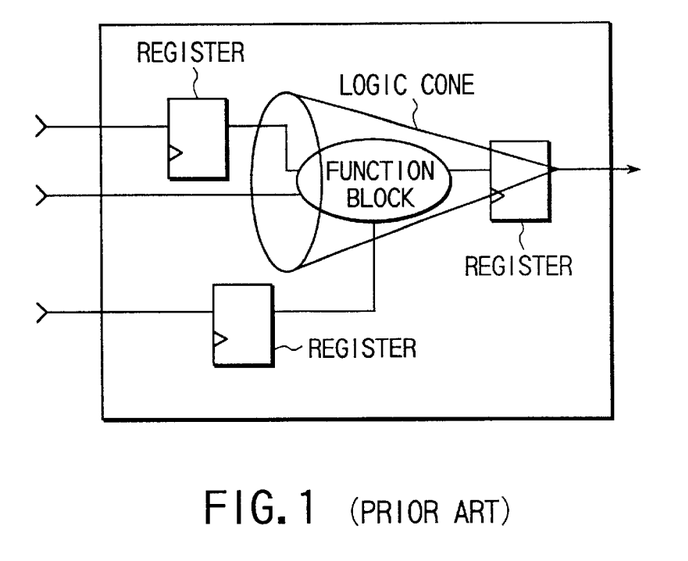
FIG. 1 is a conceptional diagram for illustrating a logic cone in formal verification.

The formal verification has mainly two kinds of techniques. A first technique is a one for directly converting the whole circuit into a logic equation. A second technique is a one for first splitting the circuit into small portions called logic cones (logic circuit groups) and then converting the individual logic cone units into individual logic equations. FIG. 1 illustrates concept of one logic cone. In other words, circuit portions corresponding to logic equations of a register output and an external input and output in the vicinity of a function block as a unit, are verified and compared respectively.

The above first technique has a problem in that a logic equation becomes too large to have a sufficient memory capacity, and it is practically impossible to apply this technique to an LSI. The second technique can solve this problem. However, according to the second technique, as the verification is carried out for each logic cone as a unit, there arises such a constraint that it is not possible to verify and compare the designs unless the registers included in the circuit are in the same construction.

For example, assume that there has arisen a portion of a circuit into which it is desired to insert a buffer from the needs of a timing adjustment, as a result of a transfer from a high-level design such as RT level design (Register Transfer level design) or the like, to a gate level description. In this case, it is possible to utilize the equivalence verifying function according to the formal verification, if it is possible to complete the design alteration without altering the register construction.

In other words, the formal verification is a tool that uses the equivalence verifying function of checking the equivalence of two circuits when there are design circuits of a higher-level circuit and a lower-level circuit in design flow. According to the formal verification, when a function is to be altered for correcting a bug, there are produced as outputs a portion where a disagreement of functions occurred and a combination of inputs at the time of the occurrence of the disagreement. Accordingly, the designer can cope with this alteration to some extent.

However, this formal verification involves no concept of time, from the nature of this verification that it logically converts the circuit description. Therefore, it is not possible to carry out a setting of an item for verification by regarding that a function altered by the designer is a known fact including the concept of time.

The formal verification is a tool using the equivalence verification function. Accordingly, it is difficult to cope with a design alteration, and the applicable range of the formal verification is limited according to the current design flow. At the time of an RT level designing, functions and register structures are altered frequently. Therefore, under the current circumstances, it is not possible to effectively introduce the formal verification into the high-level designing such as the RT level design which most requires the verification of functions.

BRIEF SUMMARY OF THE INVENTION

In the light of the above-described situation, it is an object of the present invention to provide a design verification device, a method and a memory medium therefor, for a semiconductor integrated circuit, capable of effectively introducing the formal verification even in a higher-level design and capable of constructing a high-speed function verification environment with high verification assurance.

A design verification device, a method and a memory medium therefor, for a semiconductor integrated circuit, has a function verification system which has an input of a circuit description before an alteration and a circuit description after the alteration and identifies an altered portion according to a disagreed portion, wherein formal verification is carried out for a circuit description that can assure an agreement with a key point corresponding to an output of a register and an input and an output of a signal in the circuit descriptions before and after the alteration, and verification is carried out by utilizing an event-driven simulation for a circuit description that cannot assure an agreement or equivalence of the key point.

According to the present invention, formal verification is utilized for portions other than an altered portion in a semiconductor integrated circuit to be verified. Therefore, a high-speed verification of function can be achieved. Further, an event-driven simulation for cutting out only an altered portion is a high-speed operation. Accordingly, it is possible to obtain an environment under which it possible to achieve a high-speed verification of function in a large-scale integrated circuit (LSI).

The invention will be explained in more detail. According to a first aspect of the present invention, there is provided a design verification device for a semiconductor integrated circuit, the device including: a mechanism for identifying an altered portion according to a disagreed portion of the circuit description from input means for inputting a circuit description before an alteration and a circuit description after the alteration; and verification means by simulation for carrying out formal verification for a circuit description that can assure an agreement with a key point corresponding to an output of a register and an input and an output of a signal in the circuit descriptions before and after the alteration, and for carrying out verification by utilizing an event-driven simulation for a circuit description that cannot assure an agreement or equivalence of the key point in the circuit descriptions before and after the alteration.

According to a second aspect of the invention, there is provided a design verification device for a semiconductor integrated circuit, the device including: means for identifying an altered portion for mapping a key point corresponding to an output of a register and an input and an output of a signal in the input circuit descriptions before an alteration and after the alteration, setting as an external input and output a key point of which descriptions before and after the alteration agree with each other, the key point being closest to a disagreed portion between the descriptions before and after the alteration, and modularizing a circuit portion including the altered portion; verification means by simulation for verifying the modularized circuit portion in the circuit descriptions before and after the alteration respectively by utilizing an event-driven simulation; and means for formal verification for verifying the circuit except for the modularized circuit by utilizing formal verification for the circuit descriptions before and after the alteration respectively by reflecting only a node that has been regarded as the external input and output.

According to a third aspect of the invention, there is provided a design verification method for a semiconductor integrated circuit, the method including: a process of inputting a circuit description before an alteration and a circuit description after the alteration; a process of identifying an altered portion according to a disagreed portion; a process of carrying out formal verification for a circuit description that can assure an agreement of a key point corresponding to an output of a register and an input and an output of a signal in the circuit descriptions before and after the alteration; and a process of carrying out a verification utilizing an event-driven simulation for a circuit description that cannot assure an agreement or equivalence of the key point.

According to a fourth aspect of the invention, there is provided a design verification method for a semiconductor integrated circuit, the method including: a process for inputting a circuit description before an alteration and a circuit description after the alteration; a process for identifying an altered portion for mapping a key point corresponding to an output of a register and an input and an output of a signal in the above input circuit descriptions, setting as an external input and output a key point at a closest position of which circuit description before the alteration agrees with the circuit description after the alteration from a portion of disagreement between the circuit descriptions before and after the alteration, and modularizing a circuit portion including the altered portion; a verification process by simulation for verifying the modularized circuit portion in the circuit descriptions before and after the alteration respectively by utilizing an event-driven simulation; and a formal verification process for verifying the circuit except for the modularized circuit by utilizing formal verification for the circuit descriptions before and after the alteration respectively by reflecting only a node that has been regarded as the external input and output.

According to a fifth aspect of the invention, there is provided a memory medium, readable by computer, for storing at least a design verification program for a semiconductor integrated circuit, the program including: a process for inputting a circuit description before an alteration and a circuit description after the alteration; a process for identifying an altered portion for mapping a key point corresponding to an output of a register and an input and an output of a signal in the above input circuit descriptions, setting as an external input and output a key point of which descriptions before and after the alteration agree with each other, the key point being closest to a disagreed portion between the descriptions before and after the alteration, and modularizing a circuit portion including the altered portion; a verification process by simulation for verifying the modularized circuit portion in the circuit descriptions before and after the alteration respectively by utilizing an event-driven simulation; and a formal verification process for verifying the circuit except for the modularized circuit by utilizing formal verification for the circuit descriptions before and after the alteration respectively by reflecting only a node that has been regarded as the external input and output.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 2:
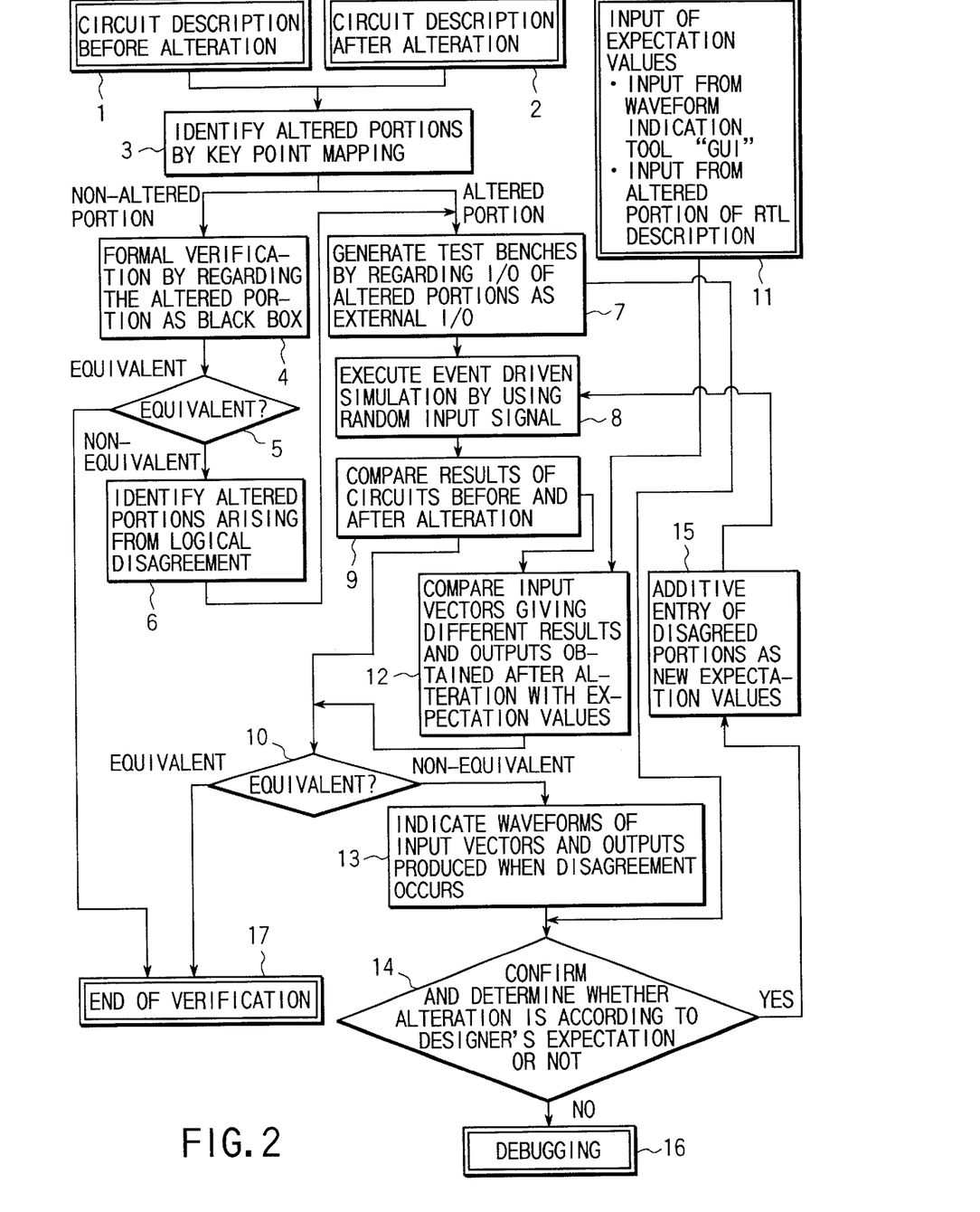
FIG. 2 is a flow chart for showing a design verification method for a semiconductor integrated circuit according to a first embodiment of the present invention.

FIG. 2 is a flow chart for showing a design verification method for a semiconductor integrated circuit according to a first embodiment of the present invention. First, at least the following processing flows (A) and (B) with reference to the drawing are important for the design verification of the present invention.

(A) A circuit description before an alteration 1 and a circuit description after the alteration 2 are input. Then, an altered portion is identified according to a disagreed portion of key point mapping.

In other words, as shown in process 3, key points for showing a configuration of signal input and output nodes in the circuit descriptions 1 and 2 are mapped. Depending on a degree of alteration, all the key points can be mapped or a part of the key points cannot be mapped. When a disagreed portion has been recognized by this mapping, an input to and an output from the altered portion are processed as an external input and output according to the disagreed portion.

More specifically, a key point of which circuit descriptions before and after the alteration agree with each other closest to the disagreed portion is regarded as an external input and output. Even when a part of the whole key points is not mapped, it is possible to assign a key point mapped at a closed position of which description before and after the alteration agree with each other, and to regard this key point as an external input and output. In other words, only a circuit description portion including an altered portion is modularized to specify the altered portion.

Further, as shown in process 6, of the circuit portion for which formal verification has been carried out as a result of the non-altered portion, when there has arisen a logical disagreement, the circuit portion including this logically altered portion is modularized to identify this logically altered portion.

In the process 6, of the logic cones following the formal verification, the input and output of the logic cone including the node that has been regarded as an external input and output before the formal verification at the specified logically altered portion and its peripheral region, is regarded as an external input and output. Then, the circuit description including this logically altered portion is cut out and modularized.

(B) Formal verification is carried out (processes 4 and 5) for the circuit description that can assure an agreement of the key point out of the circuit descriptions 1 and 2 before and after the alteration. For the circuit description that cannot assure the mapping or equivalence of the key point, verification is carried out by utilizing an event-driven simulation (processes 7, 8, 9 and 10).

In other words, in the process 4, a circuit is verified by utilizing a formal verification for the circuit descriptions before and after the alteration respectively. In this case, if there are circuit portions modularized in the process 3, only the node which has been regarded as an external input and output is reflected for each circuit portion. More specifically, an overall formal verification is carried out for each of the circuit descriptions before and after the alteration, by regarding the circuit portions including the modularized altered portions as a black box.

In the process 5, as a result of the formal verification, equivalence is judged. When there is no logically disagreed portion, the whole verification other than the altered portion is regarded as equivalent (end of verification (17)). If there is a logically disagreed portion, this is identified as an altered portion (process 6).

In the process 7, to prepare for the utilization of the event-driven simulation in the process 8, there is generated a test bench for repeatedly inputting a random test vector, of which simulation time is separated, to an input key point of each circuit portion modularized in the above process 3 (further in the process 6, if necessary).

In the process 8, a test vector is input repeatedly to the input key point of each modularized circuit before and after the alteration according to the test bench. Then, verification is carried out by utilizing an event-driven simulation.

In the process 9, results of the simulation in the modularized circuit portion before and after the alteration are compared. In the process 10, a judgment is made as to whether the results of the simulation are equivalent or non-equivalent. If a judgement of equivalence is made, the verification finishes (17).

According to the above-described method of the embodiment, it is possible to achieve a high-speed verification of a function as the formal verification is used for portions other than the altered portions in the semiconductor integrated circuit to be verified. Further, the event-driven simulation which is carried out by cutting out only the altered portions is a high-speed operation. Accordingly, it is possible to achieve a high-speed verification of a function of a large-scale integrated circuit.

When a function block of a register or the like is structured in the RT level function design, it is possible to automatically judge an altered portion and to modularize it by cutting out only an altered portion. It is of course possible to modularize an altered portion by cutting it out when the altered portion is adjacent to a plurality of logic cones or when altered portions are stacked with each other.

In other words, a high-speed verification of a function is carried out by formal verification for a circuit description portion of which register construction has not been altered. It is also possible to carry out this verification even if a combinational circuit is moved beyond a register.

Further, the process 7 has the following advantages. By utilizing an automatically-generated random test vector, it is possible to prevent an occurrence of a verification missing due to an error in preparing a test vector, and to omit a work for generating a test vector.

By automatically generating a test bench for an event-driven simulator, it is possible to prevent an error in preparing a test bench and to omit a work for preparing a test bench. Further, as a random test vector with separated simulation time is input repeatedly, it is possible to improve debugging efficiency at the time of an occurrence of a disagreement.

In the process 8, verification is carried out by simulation using an automatically-generated random test vector for small-scale circuits from which only an altered portion has been cut out. Therefore, it is possible to execute a large volume of test vectors, which improves the verification assurance.

Each process of the above-described main flow will be explained with reference to FIG. 2 again.

When results with different values have been obtained through the comparison of results of the simulation in the modularized circuit portion before and after the alteration in the process 9, there is a case where the results with different values are according to the designer's expectation.

In the process 11, the estimated expectation values of the simulation results are input by using GUI (Graphic User Interface) of a waveform indication tool, for example. These expectation values may be prepared, for example, by specifying an altered portion of a circuit before and after the alteration in the circuit description stage of an RT level, thereby to analyze the circuit description thereof, and by obtaining a test vector for which results of execution are different between before and after the alteration as well as results of the execution thereof.

Further, in the process 12, test vectors giving different results and outputs of the circuit before and after the alteration using these test vectors are compared with the expectation values, from the actual results of simulation through the processes 8 and 9. Thereafter, the process 10 is carried out, and a judgement is made as to whether the expected alteration has been made or not.

In the process 13, after the judgement is made on the result of simulation in the above process 10, a test vector in which a disagreement has occurred and outputted results thereof are produced as a file output or as a waveform indication output.

Further, in the process 14, confirmation and judgement is made of a portion where a disagreement has occurred in the circuit portion before and after the alteration displayed in the process 13. The judgement in this case refers to a judgement of whether the displayed disagreement is an alteration according to the designer's expectation or not.

In the process 14, when the alteration is according to the designer's expectation, the test vector leading to this disagreement and an output of the circuit portion after the alteration are entered additionally as new expectation values (15), to make it possible to continue the simulation by the event-driven simulator. Further, when the displayed disagreement is not according to the designer's expectation, a debugging is carried out by referring to results of the simulation (16).

In the above-described method of the present embodiment, according to the process 9, it is possible to select only the test vector of which function has been altered and a circuit output, by comparing the results of the simulation in a circuit before and after the alteration.

Further, according to the process 11, by analyzing the description of the altered portion and by preparing expectation values based on this analysis, it is possible to prevent an occurrence of an error in preparing the expectation values and missing of the expectation values. Further, according to the process 12, when a function is altered, by comparing the expectation values with the test vector which disagreed in the circuit before and after the alteration and the circuit output, it is possible to judge automatically whether only the expected alteration has been made or not.

Further, according to the process 13, there is held a wave-form indication function for wave-form displaying the outputs of a result of a simulation by the event-driven simulator. Thus, there is provided a debugging environment using the GUI.

Further, according to the processes 14 and 15, there is automatically generated an environment for executing a verification of a disagreed portion. Thus, it is possible to prevent an occurrence of a careless mistake, or a bug detection or a bug mixing due to an alteration of a function against the designer's intention. Further, it is also possible to set promptly the expectation values without causing an error in preparing the expectation values, which leads to an improved debugging efficiency.

Figure 3:
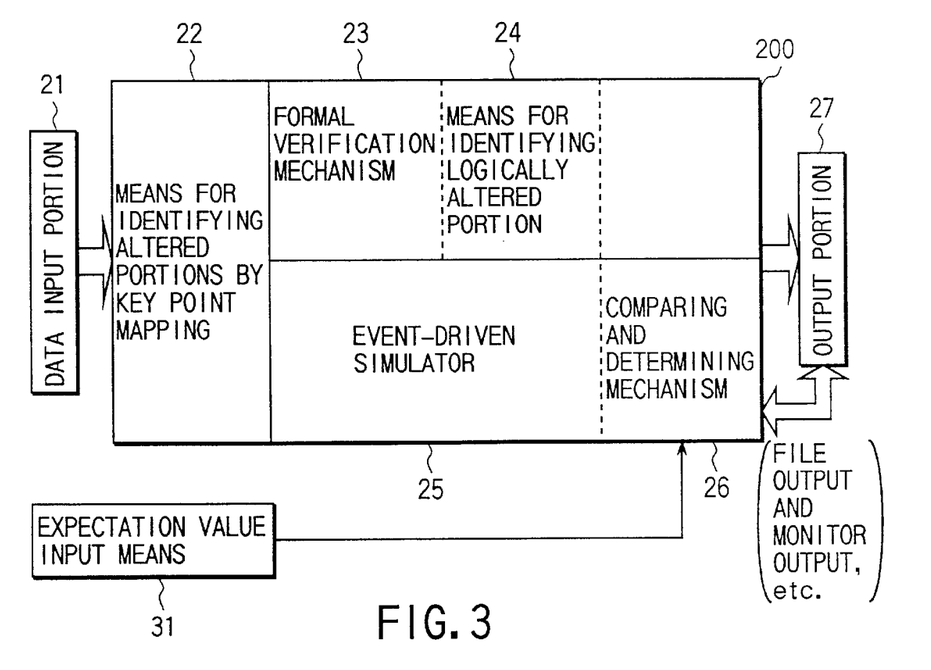
FIG. 3 is a block diagram for showing a design verification device for a semiconductor device according to a second embodiment of the invention.

FIG. 3 is a block diagram for showing a design verification device for a semiconductor device according to a second embodiment of the invention. This design verification device achieves the flow of the verification method shown in the first embodiment.

A data input portion 21 inputs circuit descriptions 1 and 2 before and after an alteration. Means for identifying altered portions by key point mapping 22 in a processing section 200 carries out a mapping of key points corresponding to an output of a register and an input and output of a signal in the circuit descriptions before and after the alteration. When there is a disagreed portion, an agreed key point closest to the disagreed portion is set as an external input and output, and the circuit portion including the altered portion is modularized.

As for a key point mapping, depending on the degree of alteration, it is not possible to map a part of all the key points. However, it is possible to assign a key point mapped at a closest position of which circuit descriptions before and after the alteration agree with each other, and to regard it as an external input and output. In other words, it is possible to modularize only the circuit description portion including the altered portion thereby to specify the altered portion.

A formal verification mechanism 23 in the processing section 200 verifies the whole circuit by utilizing formal verification to each of the modularized circuits before and after the alteration by reflecting only the node that has been regarded as the external input and output.

When a logical disagreement occurred in the formal verification mechanism 23, means for identifying a logically altered portion 24 regards the input and output of a logic cone including the node, that has been regarded as an external input and output before the formal verification at a specified logical altered portion and its periphery out of the logic cones after the formal verification, as an external input and output, and the circuit description is cut out and modularized.

An event-driven modulator 25 in the processing section 200 simulates each of the modularized circuit portions before and after the alteration. The modularized circuit portion is a circuit portion modularized by the means for identifying altered portions by key point mapping 22. A circuit portion modularized by the means for identifying a logically altered portion 24 is also added if any.

The above-described simulation is a verification utilizing an event-driven simulation for repetitively inputting to the input key point a random test vector of which simulation time is separated according to the test bench.

For the circuit description before and after the alteration, there is provided a comparing and determining mechanism 26 for comparing results of the simulation. When a disagreement is detected by the comparing and determining mechanism 26, an output portion 27 obtains a test vector of which disagreement has occurred and a resulting output. The resulting output is produced as, for example, a file output or a monitor output such as a waveform display.

Functions according to FIG. 3 will be explained below.

Expectation value input means 31 inputs estimated expectation values of results of a simulation by using GUI of a waveform display tool, for example. The expectation values may be prepared by not only the above method, but also by specifying, for example, an altered portion of a circuit before and after the alteration in the circuit description stage of an RT level, thereby to analyze the circuit description thereof, and by obtaining a test vector for which results of execution are different between before and after the alteration as well as results of the execution thereof.

The comparing and determining mechanism 26 compares test vectors giving different results and outputs of the circuit before and after the alteration using these test vectors with the expectation values, from the actual results of simulation. In other words, a judgement is made as to whether the expected alteration has been made or not.

After the judgement is made on the result of a simulation, the output portion 27 outputs a test vector in which a disagreement has occurred and outputted results thereof as a file output or as a waveform indication output.

Further, the comparing and determining mechanism 26 carries out confirmation and judgement of a portion where a disagreement has occurred in the circuit portion before and after the alteration. In other words, when the displayed disagreement is not the alteration according to the designer's expectation, the test vector leading to this disagreement and an output of the circuit portion after the alteration are entered additionally as new expectation values, to make it possible to continue the simulation by the event-driven simulator. Further, when the displayed disagreement is not the alternation according to the designer's expectation, a debugging is carried out by referring to results of the simulation.

The above embodiment has effects similar to those of the first embodiment. In other words, according to the present embodiment, it is possible to achieve a high-speed verification of a function as the formal verification is used for portions other than the altered portions in the semiconductor integrated circuit to be verified. Further, the event-driven simulation which is carried out by cutting out only the altered portions is a high-speed operation. Accordingly, it is possible to achieve a high-speed verification of a function of a large-scale integrated circuit.

When a function block of a register or the like is structured in the RT level function design, it is possible to automatically judge an altered portion and to modularize it by cutting out only an altered portion. It is of course possible to modularize an altered portion by cutting it out even when the altered portion is adjacent to a plurality of logic cones or when altered portions are stacked with each other.

In other words, a high-speed verification of a function is carried out by formal verification for a circuit description portion of which register construction has not been altered. It is also possible to carry out this verification even when a combinational circuit is moved beyond a register.

The comparing and determining mechanism 26 compares results of a simulation in the circuits before and after the alteration. Thus, it is possible to select only the test vector of which function has been altered and a circuit output. Further, by preparing expectation values, the expectation value input means 31 can prevent an occurrence of an error in preparing the expectation values and missing of the expectation values. Further, when a function is altered, by comparing the expectation value with the test vector which disagreed in the circuit before and after the alteration and the circuit output, it is possible to judge automatically whether only the expected alteration has been made or not.

Further, the comparing and determining mechanism 26 automatically generates an environment for executing a verification of a disagreed portion. Thus, it is possible to prevent an occurrence of a careless mistake, or a bug detection or a bug mixing due to an alteration of a function against the designer's intention. Further, it is also possible to set promptly the expectation values without causing an error in preparing the expectation values, which leads to an improved debugging efficiency.

Further, the output portion 27 has a function of waveform-displaying the outputs of a result of a simulation by the event-driven simulator. Thus, there is provided a debugging environment using the GUI.

Figure 4:
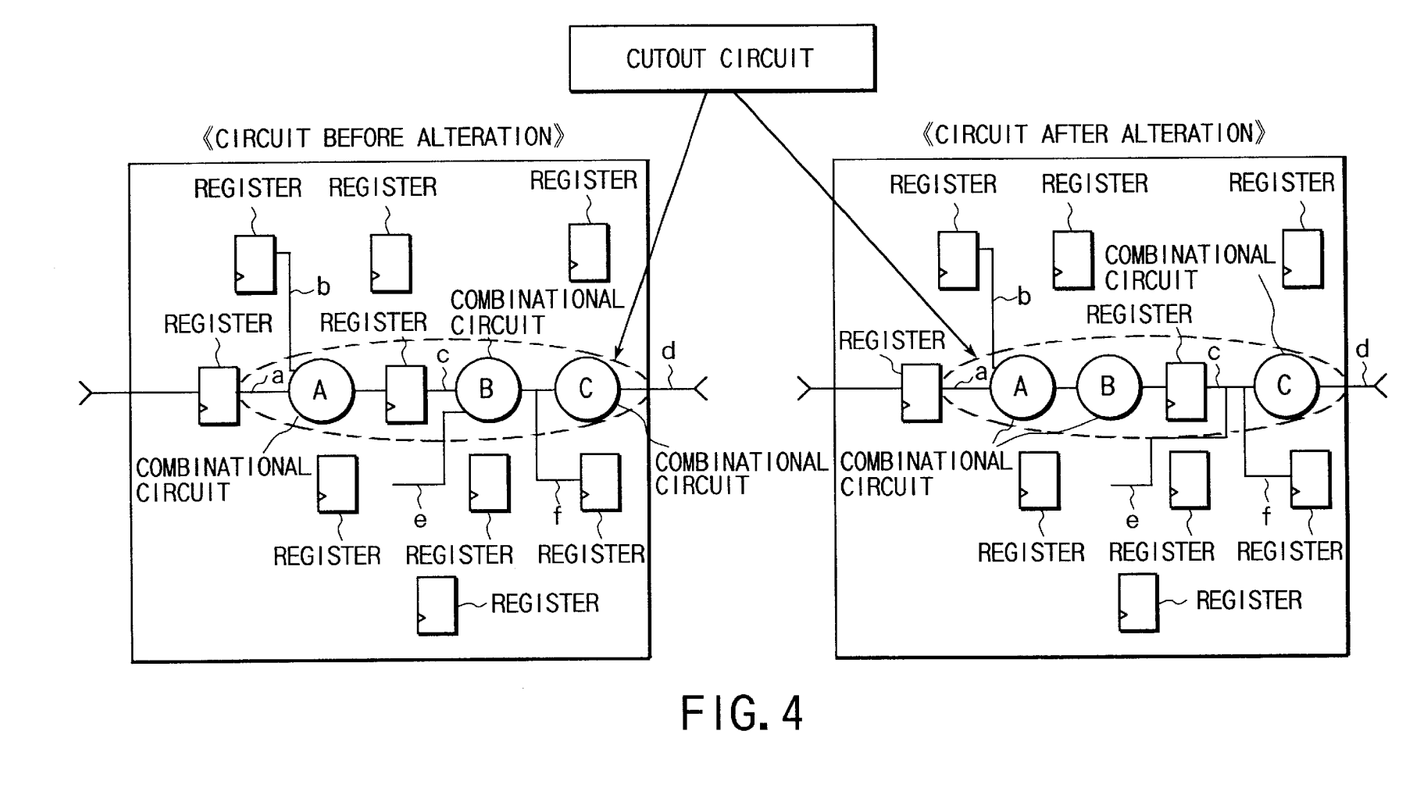
FIG. 4 is a first circuit-block diagram for showing a circuit portion before an alteration and a circuit portion after the alteration, for explaining an example of a design verification of a semiconductor integrated circuit.
Figure 5A:
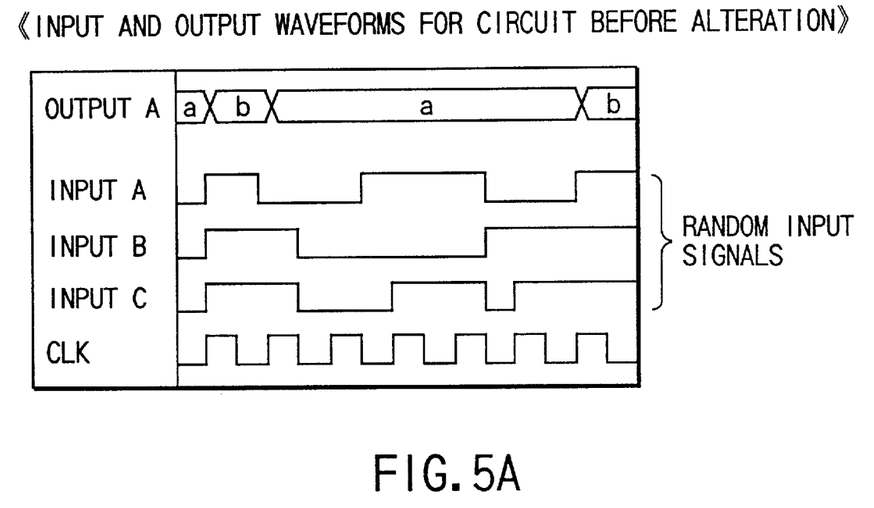
FIGS. 5A and 5B are timing charts respectively for showing input and output waveforms of a circuit before an alteration and input and output waveforms of the circuit after the alteration, for explaining an example of a design verification of a semiconductor integrated circuit.
Figure 5B:
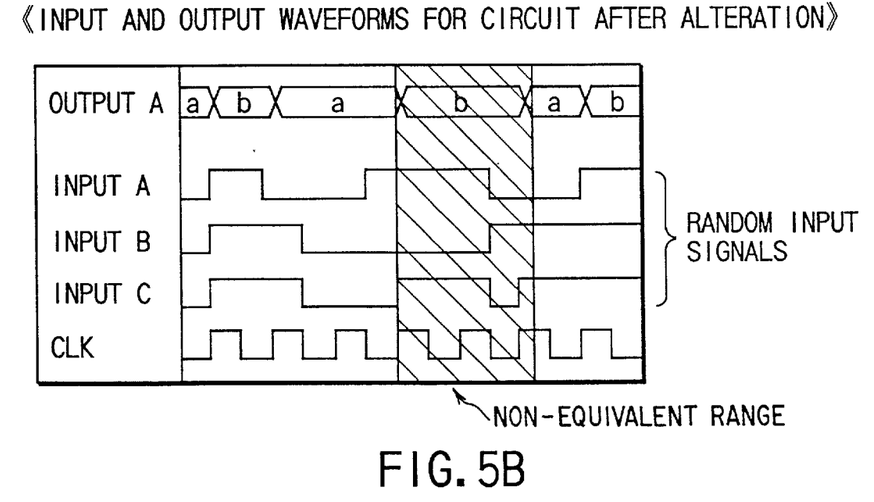
Figure 6:
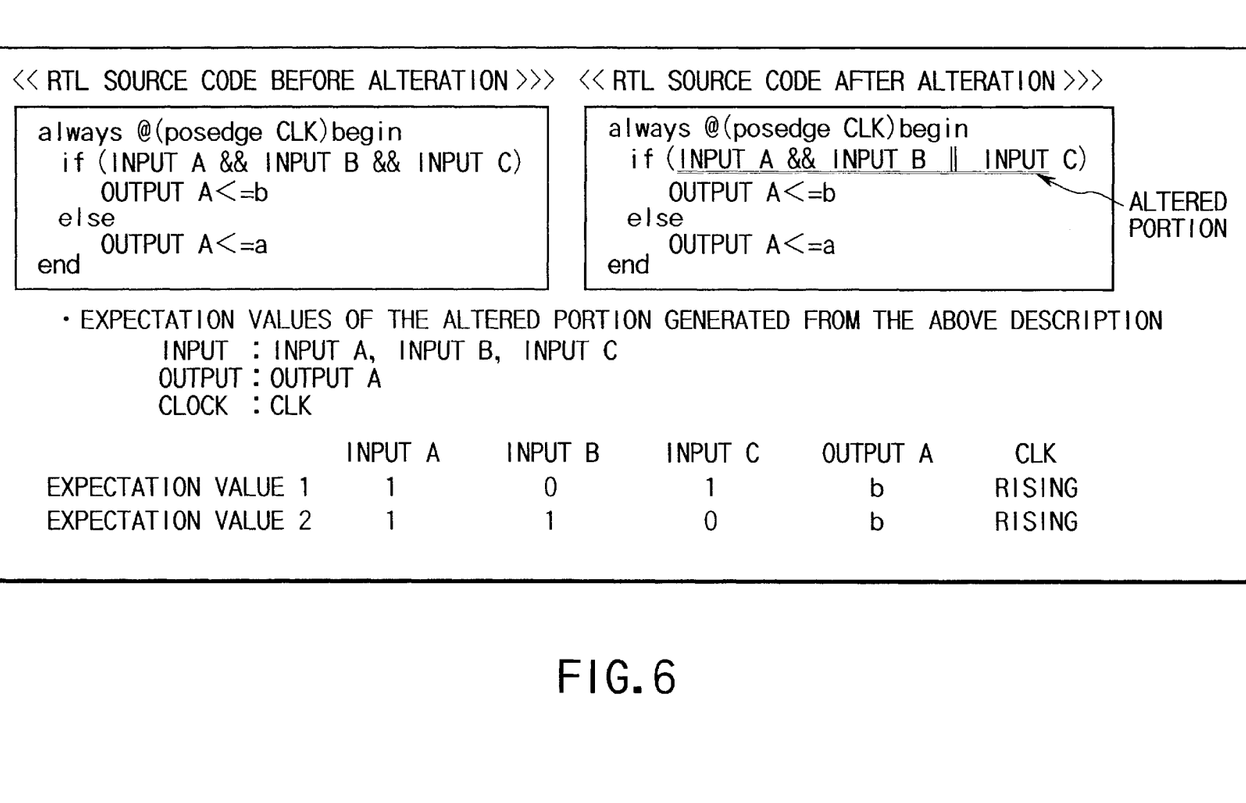
FIG. 6 is an explanatory diagram for showing a state of a generation of expectation values of an altered portion from source codes before and after an alteration of an RT level design.
Figure 7:
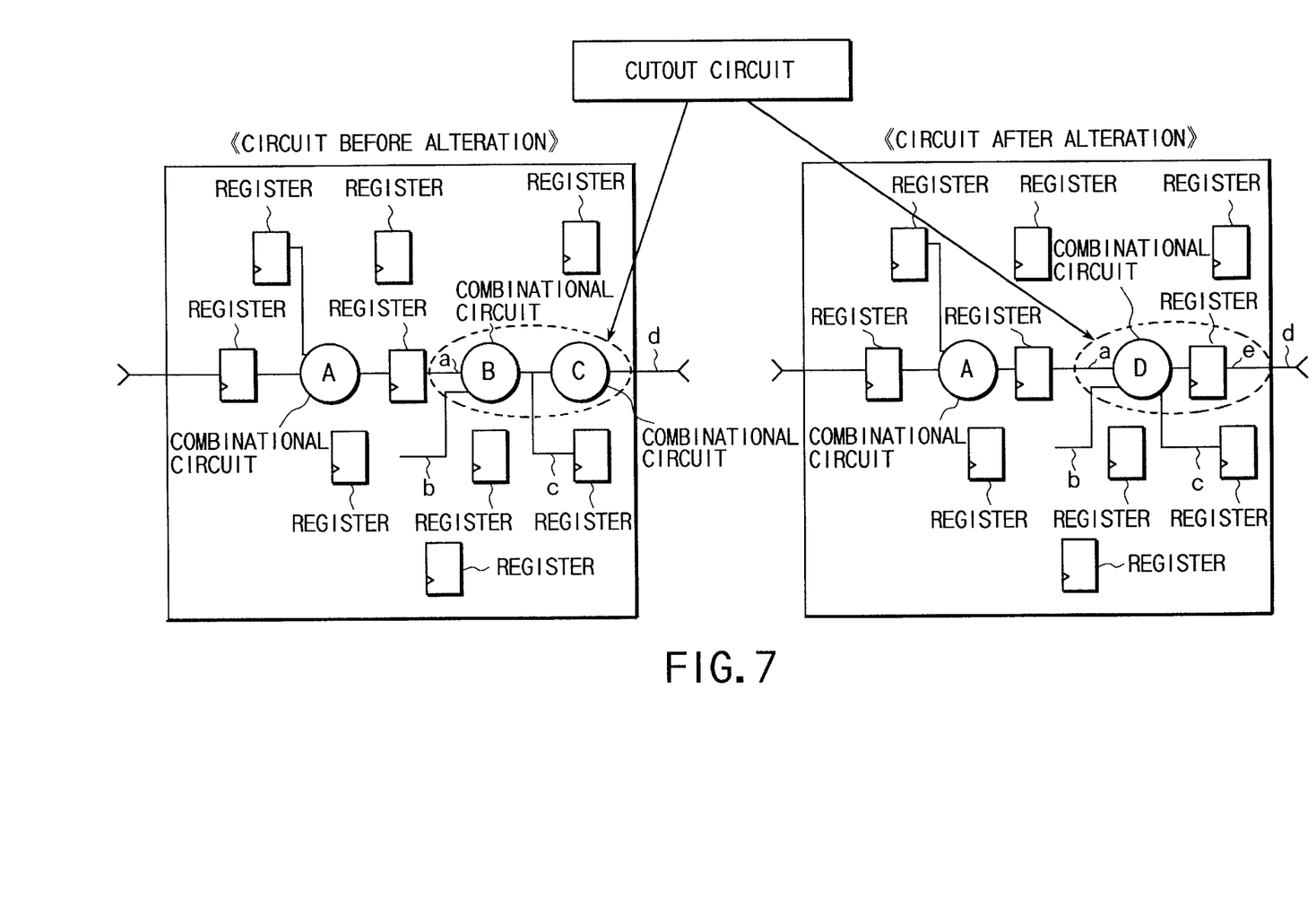
FIG. 7 is a second circuit-block diagram for showing a circuit portion before an alteration and a circuit portion after the alteration, for explaining an example of a design verification of a semiconductor integrated circuit.

Based on the above-described first and second embodiments, there will be explained in detail below a design verification method of the present invention for the following cases (1) to (3). FIG. 4 shows a circuit before an alteration and a circuit after the alteration on the left side and the right side of the drawing, for use in the case (2) respectively. FIGS. 5A and 5B show an input and output waveform of a circuit portion before an alteration and an input and output waveform of the circuit portion after the alteration, for use in the case (2) respectively. FIG. 6 is an explanatory diagram for showing a state of a generation of expectation values of an altered portion from source codes before and after an alteration of an RT level design. FIG. 7 shows a combinational circuit portion before an alteration and a combinational circuit portion after the alteration, for use in the case (3) respectively.

(1) <Altered register construction: No, Altered function: No>

Example: Buffer insertion in gate level description, displacement of a cell, and timing tuning.

(i) It is possible to map all the key points (register output and external input and output) in the input circuit descriptions before and after an alteration (process 3).

(ii) Execution of formal verification (process 4) An output of a report that the two circuits are equivalent (process 5).

(iii) End of verification of function Therefore, in the above case (1), it is possible to achieve a desired verification of design by using only formal verification.

(2) <Altered register construction : No, Altered function: Yes>

Example 1: A mixing of a bug in the buffer insertion in gate level description, displacement of a cell, and timing tuning.

Example 2: Moving a part of a combinational circuit between registers to between other registers in the RT level description (resource sharing).

Example 3: A mixing of a bug at the time of altering a combinational circuit description in the RT level description.

Of the above examples, the case 2 will be explained.

(i) It is possible to map all the key points (register output and external input and output) in the input circuit descriptions before and after an alteration (process 3).

(ii) Execution of formal verification (process 4).

(iii) A report of a disagreed portion is output. In FIG. 4, there are produced report outputs of disagreement in function at two portions of a combinational circuit A of a circuit before an alteration and a combinational circuit A and B of a circuit after the alteration, and a combinational circuit B and C of a circuit before an alteration and a combinational circuit C of a circuit after the alteration (process 5).

(iv) When a plurality of logic cones are in disagreement, signals are sequentially traced from external input and output signals in order to cut out all of these disagreed circuits. Then, circuits are cut out by setting as an external input and output a first point of external input and output of logically disagreed portion. In FIG. 4, nodes a, b and e are set as external inputs and node d and f are set as external outputs for the circuit portions before and after the alteration, and the circuit within the dotted line is cut out and modularized (process 6).

(v) There are prepared a test bench for carrying out an event-driven simulation of the cut-out circuit, and a simulation description for repetitively inputting a random signal separated with a predetermined simulation time for input.

The repetitive input of the random signal by separating the simulation time has an advantage that it is efficient to do so in handling the test vector for debugging at a later stage (process 7).

(vi) A simulation is executed (process 8).

(vii) The cut-out two circuit outputs before and after the alteration are sequentially compared. A signal change at every simulation time is output as a file and they are compared, by using a vcd file or a system task (process 9).

(viii) When a disagreement occurred between the file outputs, the file outputs are compared with expectation values if there are expectation values. When the signal changes agree with the expectation values, the simulation is continued in order to improve the coverage (process 12). The expectation values can be registered in the middle of the simulation even when, for example, the designer is aware of altered portions and also if the input and output state of different operations is already known.

(ix) When the file outputs disagree with the expectation values or when no expectation values have been input, the test vector at the time of the occurrence of the disagreement and the output results are reported. Then, the random input signal of the disagreement and the output signals are output in a file format that can be displayed as waveforms (process 13).

(x) A debugging is carried out by using the waveform display tool, the test bench and the output test vector. In the case of FIGS. 5A and 5B, when the two waveforms before and after the alteration are compared by using a comparing function of the waveform display tool, it can be judged that the shaded portion is a non-equivalent range. The designer makes a decision as to whether the non-equivalent range is according to the designer's expectation or not by looking at the waveforms (process 14).

Based on the above decision, when the results are according to the designer's expectation, the shaded portion is registered as the expectation values (process 15), and the simulation is continued. When the assurance has become sufficient, the verification is finished. If the shaded portion is not according to the designer's expectations, a debugging work is carried out (process 16: a separate flow not shown).

The method of inputting the above expectation values will be explained. This is a technique of inputting the expectation values graphically by using the GUI of the waveform display tool, for example. In the case of FIG. 5B, the input and output signal vector within the shaded line becomes the expectation values, and this pattern is input in advance.

This method is also a technique for generating the expectation values of an altered portion from the source codes before and after the alteration of the RT level design, for example. As shown in FIG. 6, when the input description is at the RT level, by clicking the altered portion of the source code, a conditional equation for executing the altered portion is analyzed and the vector of the expectation values are generated.

In the case of FIG. 6, it is possible to change the conditional equation of if statement. Therefore, at the rise time of CLK, there is set as the expectation values the vector that OUTPUT B becomes b when INPUT A=1 and INPUT B or C is 1.

(3) <Altered register construction : Yes, Altered function: Yes>

Example: Bug correction in the RT level description. Altered specification, or altered description for high-speed operation.

(i) There occurs a key point that cannot be mapped in the circuit descriptions to be input before and after an alteration. When disagreed portions have been recognized in a plurality of logic cones, signals are sequentially traced from the external input and output signals in order to cut out all of these circuits. Then, a key point mapped at a position closest to the key point that cannot be mapped is regarded as an external input and output, and the circuit is cut out and modularized (process 3). In the case of FIG. 7, for example, nodes a and b are regarded as external inputs and nodes c and d are regarded as external outputs, and the circuit is cut out and modularized.

(ii) There are prepared a test bench for carrying out an event-driven simulation of the cut-out circuit, and a simulation description for repetitively inputting a random signal separated with a predetermined simulation time for input. The repetitive input of the random signal by separating the simulation time has an advantage that it is efficient to do so in handling the test vector for debugging at a later stage (process 7).

(iii) A simulation is executed (process 8).

(iv) The cut-out two circuit outputs before and after the alteration are sequentially compared. A signal change at every simulation time is output as a file and they are compared, by using a vcd file or a system task (process 9).

(v) When a disagreement occurred between the file outputs, the file outputs are compared with expectation values if there are expectation values. If the signal changes agree with the expectation values, the simulation is continued in order to improve the coverage (process 12). The expectation values can be registered in the middle of the simulation even when, for example, the designer is aware of altered portions and also even when the input and output state of different operations is already known. The method of inputting the expectation values is similar to that described in the example (2).

(vi) When the file outputs disagree with the expectation values or when no expectation values have been input, the test vector at the time of the occurrence of the disagreement and the output results are reported. Then, the random input signal for which the disagreement occurred and the output signals are output in a file format that can be displayed as waveforms (process 13).

(vii) A debugging is carried out by using the waveform display tool, the test bench and the output test vector. The two waveforms before and after the alteration are compared by using a comparing function of the waveform display tool. When the alteration is according to the designer's expectation, the necessary portion is registered as the expectation values, and the simulation is continued (processes 14 and 15).

(viii) On the other hand, the input to and output from the circuit portion cut out and modularized in the above (i) is handled as the external input and output. The circuit portion including the modularized altered portion is handled as a black box, and an overall verification is executed for the circuit descriptions before and after the alteration respectively (process 4).

(ix) When there is a disagreed portion, the processes similar to those in the above (iii) and after of the example (2) are carried out, and then the verification is finished.

Based on the above-described design verification, for a semiconductor integrated circuit to be verified, it is possible to achieve a high-speed verification of functions by formal verification for portions other than an altered portion and to achieve a high-speed event-driven simulation with high verification assurance by cutting out only the altered portion.

Further, it is also within a range of the present invention that a basic design verification method according to the present invention included in the processing flow of the FIG. 2 has been programmed, in a computer-readable memory medium that stores at least a design verification program for a semiconductor integrated circuit for operating the computer.

In other words, the recording medium according to the present invention is programmed to include: the process of inputting a circuit description before an alteration and a circuit description after the alteration; the process of identifying an altered portion according to a disagreed portion; the process of carrying out formal verification for a circuit description that can assure an agreement of a key point corresponding to an output of a register and an input and an output of a signal in the circuit descriptions before and after the alteration; and the process of carrying out a verification utilizing an event-driven simulation for a circuit description that cannot assure an agreement or equivalence of the key point.

As explained above, according to the present invention, it is possible to effectively introduce formal verification in the high-order design such as the RT level design that most requires the verification of functions. In other words, as formal verification can be utilized for portions other than the altered portions in the circuit descriptions before and after the alteration, it is possible to carry out a high-speed verification of functions.

Further, the event-driven simulation carried out by cutting out only the altered portions is a high-speed operation, which makes it possible to improve the verification assurance. Accordingly, it is possible to provide a design verification device, a method and a memory medium therefor, for a semiconductor integrated circuit, capable of achieving a high-speed function verification environment with high reliability, for a large-scale integrated circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A design verification device for a semiconductor integrated circuit, the device comprising:
   a mechanism for identifying an altered portion according to a disagreed portion of a circuit description from input means for inputting the circuit description before an alteration and a circuit description after the alteration; and
   verification means including (i) means for determining portions of the circuit description, which correspond to an output of each of registers, an external input to the circuit description and an output from the circuit description, as key points, and (ii) means for cutting out a logic connected between each of the key points and a preceding key point, as a logic circuit group, said verification means being used for carrying out formal verification for the logic circuit group that can assure an agreement or equivalence of the key point in the circuit descriptions before and after the alteration, and for carrying out verification by utilizing an event-driven simulation for the logic circuit group that cannot assure an agreement or equivalence of the key point to the circuit descriptions before and the after the alteration.

2. A design verification device according to claim 1, further comprising:
   a function of inputting expectation values relating to the circuit descriptions before and after the alteration in the verification means by simulation; and
   comparing and determining means for comparing actual results of simulation from the verification means by simulation with the expectation values.

3. A design verification device according to claim 2, wherein the comparing and determining means compares a test vector for which a disagreement has occurred and an output according to the circuit descriptions before and after the alteration using this test vector with the expectation values, based on the actual results of simulation from the verification means by simulation, thereby to determine whether an alteration according to the expectation has been made or not.

4. A design verification device according to claim 2, wherein the expectation values are prepared by specifying art altered portion of a circuit before and after the alteration in the circuit description stage of a register transfer level, thereby to analyze the circuit description thereof, and by obtaining a test vector for which results of execution are different between before and after the alteration as well as results of the execution thereof, or by inputting a test vector and results of the execution thereof from a wave form indicated by a graphical user interface.

5. A design verification device according to claim 2, further comprising a function of registering as new expectation values an output of the circuit portion relating to the circuit descriptions before and after the alteration using the test vector for which the disagreed portion has occurred, thereby to make it possible to continue the event-driven simulation.

6. A design verification device for a semiconductor integrated circuit, the device comprising:
   means for determining portions of the circuit description, which correspond to an output of each of registers, an external input to the circuit description and an output from the circuit description, as key points;
   means for cutting out a logic connected between each of the key points and a preceding key point, as a logic circuit group;
   means for identifying an altered portion for mapping the key point in the circuit descriptions before an alteration and after the alteration, setting as an external input and output a key point of which descriptions before and after the alteration agree with each other, said key point being closest to a disagreed portion between the circuit descriptions before and after the alteration, and modularizing a circuit portion including the altered portion,
   verification means by simulation for verifying the modularized circuit portion in the circuit descriptions before and after the alteration respectively by utilizing an event-driven simulation; and
   means for formal verification for verifying the logic circuit group except for the modularized circuit by utilizing formal verification for the circuit descriptions before and after the alteration respectively by reflecting only a node that has been regarded as the external input and output.

7. A design verification device according to claim 6, wherein the means for formal verification has a function of assuming that there is a logically altered portion in the circuit descriptions before and after the alteration, when a logical disagreement occurred, and regarding as external input and output the input to and output from a logic cone including a node that has been regarded as the external input and output and the logically altered portion out of logic cones following the formal verification, thereby to cut out and modularize the circuit description including the logically altered; and, the verification means by simulation verifies each modularized circuit portion in the circuit descriptions before and after the alteration.

8. A design verification device according to claim 6, further comprising test bench generating means for generating a random test vector with a separated simulation time repetitively input to an input key point of each of the modularized circuit portions, for utilizing the event-driven simulation.

9. A design verification device according to claim 6, further comprising:
   a function of inputting expectation values relating to the circuit descriptions before and after the alteration in the verification means by simulation; and
   comparing and determining means for comparing actual results of simulation from the verification means by simulation with the expectation values.

10. A design verification device according to claim 7, further comprising test bench generating means for generating a random test vector with a separated simulation time repetitively input to an input key point of each of the modularized circuit portions, for utilizing the event-driven simulation.

11. A design verification device according to claim 7, further comprising:
   a function of inputting expectation values relating to the circuit descriptions before and after the alteration in the verification means by simulation; and
   comparing and determining means for comparing actual results of simulation from the verification means by simulation with the expectation values.

12. A design verification device according to claim 8, further comprising:
   a function of inputting expectation values relating to the circuit descriptions before and after the alteration in the verification means by simulation; and
   comparing and determining means for comparing actual results of simulation from the verification means by simulation with the expectation values.

13. A design verification device according to claim 9, wherein the comparing and determining means compares a test vector for which a disagreement has occurred and an output according to the circuit descriptions before and after the alteration using this test vector with the expectation values, based on the actual results of simulation from the verification means by simulation, thereby to determine whether an alteration according to the expectation has been made or not.

14. A design verification device according to claim 9, wherein the expectation values are prepared by specifying an altered portion of a circuit before and after the alteration in the circuit description stage of a register transfer level, thereby to analyze the circuit description thereof, and by obtaining a test vector for which results of execution are different between before and after the alteration as well as results of the execution thereof, or by inputting a test vector and results of the execution thereof from a wave form indicated by a graphical user interface.

15. A design verification device according to claim 9, further comprising a function of registering as new expectation values an output of the circuit portion relating to the circuit descriptions before and after the alteration using the test vector for which the disagreed portion has occurred, thereby to make it possible to continue the event-driven simulation.

16. A design verification method for a semiconductor integrated circuit, the method comprising:
   a process of inputting a circuit description before an alteration and a circuit description after the alteration,
   a process of identifying an altered portion according to a disagreed portion;
   a process of determining portions of the circuit description, which correspond to an output of each of registers, an external input to the circuit description and an output from the circuit description, as key points;
   a process of cutting out a logic connected between each of the key points and a preceding key point, as a logic circuit group;
   a process of carrying out formal verification for the logic circuit group that can assure an agreement or equivalence of the key point in the circuit descriptions before and after the alteration; and
   a process of carrying out verification by utilizing an event-driven simulation for the logic circuit group that cannot assure an agreement or equivalence of the key point.

17. A design verification method according to claim 16, further comprising:
   a process of inputting expectation values relating to the circuit descriptions before and after the alteration in the process of verification by simulation; and
   a comparing and determining process of comparing actual results of simulation in the process of verification by simulation with the expectation values.

18. A design verification method according to claim 17, further comprising: a process of registering as new expectation values an output of a circuit portion relating to the circuit descriptions before and after the alteration using the test vector for which a disagreement has occurred in the process of verification by simulation, thereby to make it possible to continue the event-driven simulation.

19. A design verification method for a semiconductor integrated circuit, the method comprising:
   a process for inputting a circuit description before an alteration and a circuit description after the alteration;
   a process of determining portions of the circuit description, which correspond to an output of each of registers, an external input to the circuit description and an output from the circuit description, as key points;
   a process of cutting out a logic connected between each of the key points and a preceding key point, as a logic circuit group;
   a process for identifying an altered portion for mapping the key point in the circuit descriptions, setting as an external input and output a key point at a closest position of which description before the alteration agrees with the description after the alteration from a portion of disagreement between the descriptions before and after the alteration, and modularizing a circuit portion including the altered portion;
   a verification process by simulation for verifying the modularized circuit portion in the circuit descriptions before and alter the alteration respectively by utilizing an event-driven simulation; and
   a formal verification process for verifying the logic circuit group except for the modularized circuit by utilizing formal verification for the circuit descriptions before and after the alteration respectively by reflecting only a node that has been regarded as the external input and output.

20. A design verification method according to claim 19, further comprising:
   a process for identifying a logically altered portion, for assuming that there is a logically altered portion in the circuit descriptions before and after the alteration, when a logical disagreement occurred, and for regarding as external input and output the input to and output from a logic cone including a node that has been regarded as the external input and output and the logically altered portion out of logic cones following the formal verification, and thereby cutting out and modularizing the circuit description including the logically altered; and
   a process for carrying out verification by simulation, for each modularized circuit portion in the circuit descriptions before and after the alteration.

21. A design verification method according to claim 19, further comprising:
   a process of inputting expectation values relating to the circuit descriptions before and after the alteration in the process of verification by simulation; and
   a comparing and determining process actual results of simulation in the process of verification by simulation with the expectation values.

22. A design verification method according to claim 20, further comprising:
   a process of inputting expectation values relating to the circuit descriptions before and after the alteration in the process of verification by simulation; and
   a comparing and determining process actual results of simulation in the process of verification by simulation with the expectation values.

23. A design verification method according to claim 21, further comprising a process of registering as new expectation values an output of a circuit portion relating to the circuit descriptions before and after the alteration using the test vector for which a disagreement has occurred in the process of verification by simulation, thereby to make it possible to continue the event-driven simulation.

24. A memory medium, readable by computer, for storing at least a design verification program for a semiconductor integrated circuit for operating a computer, the program comprising:
   a process for inputting a circuit description before an alteration and a circuit description after the alteration,
   a process of determining portions of the circuit description which correspond to an output of each of registers, an external input to the circuit description and an output from the circuit description, as key points;
   a process of cutting out a logic connected between each of the key points and a preceding key point, as a logic circuit group;
   a process for identifying an altered portion for mapping the key point in the circuit descriptions, setting as an external input and output a key point of which descriptions before and after the alteration agree with each other, said key point being closest to a disagreed portion between the descriptions before and after the alteration, and modularizing a circuit portion including the altered portion,
   a verification process by simulation for verifying the modularized circuit portion in the circuit descriptions before and after the alteration respectively by utilizing an event-driven simulation; and
   a formal verification process for verifying the logic circuit group except for the modularized circuit by utilizing formal verification for the circuit descriptions before and after the alteration respectively by reflecting only a node that has been regarded as the external input and output.

25. A memory medium according to claim 24, further comprising:
   a process for identifying a logically altered portion, for assuming that there is a logically altered portion in the circuit descriptions before and after the alteration, when a logical disagreement occurred in the formal verification process, and for regarding as external input and output the input to and output from a logic cone including a node that has been regarded as the external input and output and the logically altered portion out of logic cones following the formal verification, and thereby cutting out and modularizing the circuit description including the logically altered; and
   a process for carrying out verification by simulation, for each modularized circuit portion in the circuit descriptions before and after the alteration.

26. A memory medium according to claim 24, further comprising:
   a process of inputting expectation values relating to the circuit descriptions before and after the alteration in the process of verification by simulation; and
   a comparing and determining process actual results of simulation in the process of verification by simulation with the expectation values.

27. A memory medium according to claim 26, further comprising a process of registering as new expectation values an output of a circuit portion relating to the circuit descriptions before and after the alteration using the test vector for which a disagreement has occurred in the process of verification by simulation, thereby to make it possible to continue the event driven simulation.

* * * * *